(12) United States Patent
Quirke

(10) Patent No.: US 6,676,486 B1
(45) Date of Patent: *Jan. 13, 2004

(54) POLYMERIC CHEMICAL INJECTION INTO A WATER JET TO IMPROVE CUT QUALITY WHILE CUTTING VERY BRITTLE MATERIALS

(75) Inventor: David J. Quirke, San Jose, CA (US)

(73) Assignee: Lightwave Microsystems Corporation, San Jose, CA (US)

( * ) Notice: Subject to any disclaimer, the term of this patent is extended or adjusted under 35 U.S.C. 154(b) by 154 days.

This patent is subject to a terminal disclaimer.

(21) Appl. No.: 09/909,603

(22) Filed: Jul. 20, 2001

Related U.S. Application Data

(63) Continuation-in-part of application No. 09/693,347, filed on Oct. 20, 2000.

(51) Int. Cl.[7] .................................................. B24C 1/00
(52) U.S. Cl. ........................... 451/38; 451/40; 451/75; 451/102
(58) Field of Search ............................. 451/36, 38, 39, 451/40, 1, 2, 5, 6, 8, 9, 10, 75, 80, 99, 102

(56) References Cited

U.S. PATENT DOCUMENTS

| | | | | |
|---|---|---|---|---|
| 3,564,190 A | * | 2/1971 | Kandajan et al. | 205/662 |
| 3,694,972 A | * | 10/1972 | Emeis | 451/38 |
| 3,953,941 A | * | 5/1976 | Kuhn et al. | 451/2 |
| 4,101,405 A | * | 7/1978 | Inoue | 204/224 M |
| 4,548,001 A | * | 10/1985 | Link | 451/38 |
| 5,117,366 A | * | 5/1992 | Stong | 700/160 |
| 5,184,434 A | | 2/1993 | Hollinger et al. | |
| 5,279,075 A | * | 1/1994 | Sage et al. | 451/2 |
| 5,325,638 A | * | 7/1994 | Lynn | 451/39 |
| 5,527,204 A | | 6/1996 | Rhoades | |
| 5,567,964 A | | 10/1996 | Kashihara et al. | |
| 5,587,605 A | | 12/1996 | Ramsey et al. | |
| 5,679,058 A | | 10/1997 | Rhoades | |
| 5,693,596 A | | 12/1997 | Kaburagi et al. | |
| 5,757,445 A | | 5/1998 | Vu et al. | |
| 5,827,114 A | * | 10/1998 | Yam et al. | 451/75 |
| 5,840,597 A | | 11/1998 | Hartauer | |
| 5,921,846 A | | 7/1999 | Katz | |
| 5,926,586 A | | 7/1999 | Dragone et al. | |
| 5,964,644 A | * | 10/1999 | Rhoades | 451/40 |
| 6,014,965 A | * | 1/2000 | Nishida | 125/12 |
| 6,306,011 B1 | * | 10/2001 | Perry et al. | 451/38 |
| 6,379,214 B1 | * | 4/2002 | Stewart et al. | 451/2 |

* cited by examiner

*Primary Examiner*—Joseph J. Hail, III
*Assistant Examiner*—Hadi Shakeri
(74) *Attorney, Agent, or Firm*—Amin & Turocy, LLP

(57) ABSTRACT

The present invention relates to methods and systems for isolating non-rectangular shaped optical integrated circuits formed on a brittle substrate. For example, a brittle substrate comprising a plurality of non-rectangular shaped optical integrated circuits is provided on a water jet cutting system. In the water jet cutting system a mixture of water and at least one water soluble polymer is wet injected into a water stream and then a high pressure polymer water jet is used to cut the brittle substrate. The non-rectangular shaped optical integrated circuits are isolated by water jet cutting in a curvilinear manner without fatally damaging adjacent optical integrated circuits.

20 Claims, 5 Drawing Sheets

POLYMERIC CHEMICAL INJECTION INTO A WATER JET TO IMPROVE CUT QUALITY WHILE CUTTING VERY BRITTLE MATERIALS

RELATED APPLICATIONS

This application is a continuation-in-part of currently application Ser. No. 09/693,347 filed Oct. 20, 2000.

FIELD OF THE INVENTION

The present invention generally relates to fabricating optical integrated circuits. In particular, the present invention relates to efficiently isolating optical integrated circuits with high yields from substrates.

BACKGROUND OF THE INVENTION

Water jets and abrasive water jets are commonly employed in cutting and machining operations, particularly with metal sheet and plates to effect rapid and economical cutting and related forming operations. Typical applications include cutting materials which are difficult to machine, such as stainless steels, titanium, nickel alloys, reinforced polymer composites, and the like. Such techniques are particularly advantageous to produce cutting action through very highly localized action and without delamination of composite materials.

To effect water jet cutting, a specialized nozzle assembly is employed to direct a high pressure stream through an orifice to form a water jet. Typical nozzle assemblies are formed of abrasion resistant materials, such as tungsten carbide. The orifice itself may be formed of diamond or sapphire. Abrasive particles may be added to the high speed stream of water exiting the nozzle orifice by injection into the water stream near or in the nozzle. Although a turbulent flow is typically created where the particles contact the stream, the relatively stationary or slow moving abrasive particles are accelerated and become entrained in the high speed water stream. The entrainment process tends to disperse and decelerate the water stream while the abrasive particles collide with the nozzle wall and with each other. However, relatively wide kerfs undesirably result from the dispersed jet streams. Furthermore, energy is wasted when a dispersed stream is employed, and the nozzle is rapidly worn, even when made from abrasion resistant materials, such as tungsten carbide and the like.

While it may be desirable in some instances to employ abrasives in water jets, injecting abrasive particles into a water stream often results in clogging of the cutting head and/or nozzle. And the smaller the abrasive particles, the more likely clogging occurs.

Planar lightwave circuits (PLCs) are optical circuits laid out on a silicon wafer. PLCs, which typically contain one or more planar waveguides often used in arrayed waveguide gratings, are used as components in constructing an optical communication system. Optical communication systems permit the transmission of large quantities of information. With ever increasing internet traffic, greater demands are placed on optical communication systems, and their corresponding components.

A plurality of optical integrated circuits (OICs) including PLCs are typically fabricated on a single substrate or wafer. For example, a substrate may be fabricated with 30 to 40 OICs thereon. Individual OICs are isolated using a specialized saw to dice the substrate. However, OICs have a regular (consistent), non-rectangular geometry. Straight-line dicing using a saw consequently leads to the inefficient isolation of individual OICs from a substrate. Referring to FIG. 1, a substrate 100 with a plurality of PLCs 102 thereon is shown. Referring to FIG. 2, when individual PLCs 102 are isolated from the substrate 100 using a saw (square dicing), several PLCs 104 are destroyed while only one PLC 106 is recovered. Often times, two to four PLCs are destroyed for each PLC that is recovered.

Moreover, unlike machining metal substrates, PLC substrates and the components thereon are often made of monocrystalline silicon, silicon dioxide, various oxides and silicates, and other materials that have a very brittle nature. The brittle nature of such materials results in cracks and chips in the substrate or the components thereon. Since a plurality of OICs are fabricated in close proximity to one another, even small chips and cracks can render the OICs fatally defective. Cutting the brittle materials thus requires a high degree of care so as not to destroy the substrate. For this reason, specialized saws are employed to cut PLC substrates.

There is an unmet need in the to art to improve the current yields of OICs/PLCs from substrates.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

The present invention provides methods and systems for curvilinear cutting of brittle materials that permits the isolation of OICs from a substrate with high yield. The present invention provides methods and systems for curvilinear cutting of brittle materials while mitigating or eliminating edge chipping, cracking, and other degrading effects. Wet injecting a water soluble polymer into a water jet cutter improves the cut quality of brittle materials by increasing the coherency of the cutting stream and thus permit increased standoff distances. Increased standoff distances permit in situ inspection and monitoring of the curvilinear cutting process. Monitoring is particularly useful when cutting extremely brittle materials since chips and cracks are likely to occur. Wet injecting a water soluble polymer into a water jet cutter also minimizes clogging of the cutting head by abrasives that may or may not be present. As a result, the present invention maximizes the yield of non-rectangular OICs from a single substrate. The present invention also correspondingly promotes maximizing the number of non-rectangular OICs that may be fabricated on a single substrate since isolation thereof in high yield is enabled.

One aspect of the invention relates to a method of cutting a brittle substrate comprising a non-rectangular shaped optical integrated circuit, involving providing the brittle substrate comprising a plurality of non-rectangular shaped optical integrated circuits on a water jet cutting system, the brittle substrate positioned proximate a cutting head of the water jet cutting system; supplying a high pressure water stream to the cutting head; wet injecting a mixture of water and at least one water soluble polymer into the water stream; and water jet cutting the brittle substrate in a curvilinear manner to separate at least one of the plurality of non-rectangular shaped optical integrated circuits without fatally damaging an adjacent optical integrated circuit.

Another aspect of the invention relates to a system for separating a plurality of non-rectangular shaped optical integrated circuits formed on a brittle substrate, containing a brittle substrate holder for holding the brittle substrate comprising the plurality of optical integrated circuits; a supply of a mixture of water and at least one water soluble polymer connected to a water jet cutting device; a water supply connected to the water jet cutting device; the water jet cutting device comprising a cutting head; and the cutting head comprising a nozzle for expelling a jet stream under pressure for cutting the brittle substrate in a curvilinear manner, at least one of the brittle substrate holder and the cutting head movable in a curvilinear manner.

Yet another aspect of the invention relates to a method of water jet cutting a silicon substrate in a curvilinear manner, involving providing the silicon substrate on a water jet cutting system, the silicon substrate positioned proximate a cutting head having an orifice of the water jet cutting system; wet injecting a mixture of water and at least one water soluble polymer into a water stream; supplying the water stream comprising at least one water soluble polymer to the cutting head under high pressure; expelling a polymer water jet from the orifice to contact the silicon substrate; and moving the silicon substrate in a curvilinear manner in relation to the cutting head to cut the silicon substrate in a curvilinear manner while reducing at least one of chipping the silicon substrate and cracking the silicon substrate.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
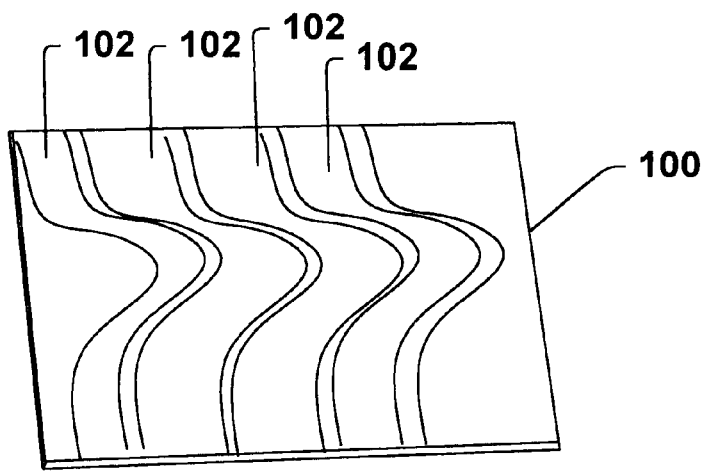
FIG. 1 illustrates a top-down view of an OIC substrate with a plurality of OICs thereon.
Figure 2:
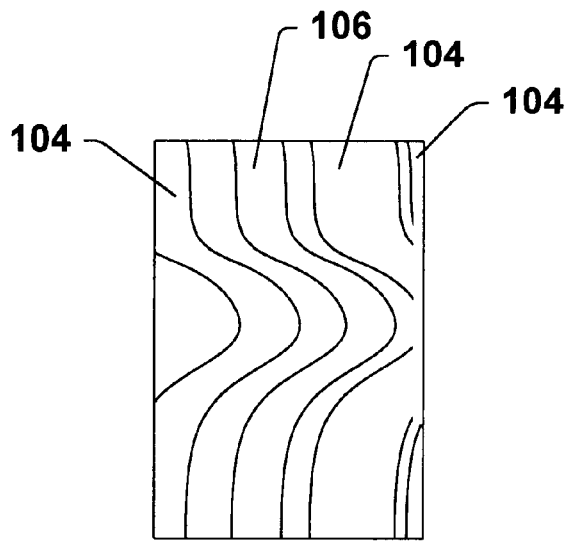
FIG. 2 illustrates a conventional manner of cutting an OIC substrate.
Figure 3:
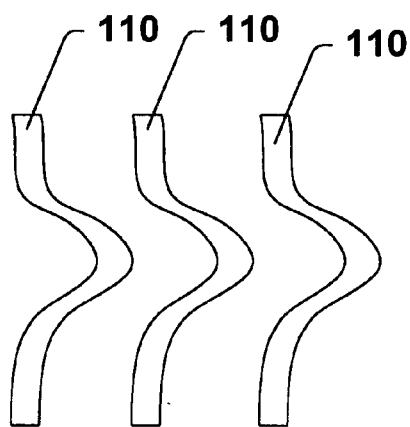
FIG. 3 illustrates OICs diced in accordance with one aspect of the present invention.

The present invention involves wet injecting a water soluble polymer into the water stream of a water jet cutter to facilitate curvilinear cutting of brittle materials such as OICs from a substrate while minimizing chipping and cracking of the substrate and clogging of the jet cutter when abrasives are employed. Referring again to FIG. 1, a substrate 100 with a plurality of PLCs 102 thereon is shown. Referring now to FIG. 3, all or substantially all of the individual PLCs 110 may be cut and isolated from the substrate 100. Curvilinear cutting is conducted to separate the non-rectangular shaped optical devices from each other. Non-rectangular shapes include shapes having at least one curvilinear edge (not straight), such as the individual PLCs 110 of FIG. 3.

The water soluble polymers are organic polymers that are at least partially soluble in water, and generally substantially soluble in water. The water soluble polymers one or more of: increase the coherency of water jet streams expelled from the nozzle; mitigate chipping and cracking in the brittle substrate during curvilinear cutting; increase the standoff distance required to cut brittle substrates (without increasing kerf width and/or mitigating chipping and cracking); promote the suspension of abrasives, when employed; facilitate the use of lower pressures; and facilitate the use of relatively small abrasive particles. Relatively small amounts of a polar organic liquid, such as ethanol or methanol, may be added to the water stream to facilitate solubilizing the water soluble polymer (such as where the water stream contains about 10% by weight or less of a polar organic liquid).

General examples of the water soluble polymers include oxygen containing polymers, polymer gelling agents such as gums, cellulose compounds, and the like. Specific examples of water soluble polymers include, but are not limited to, guar gum, xanthan gum, hydroxypropyl and hydroxyethyl derivatives of guar gum and/or xanthan gum, and related hydroxyl group containing or substituted gums, arabic, tragacanth, karaya, hydroxymethyl cellulose, hydroxyethyl cellulose, and related water soluble cellulose derivatives, hydroxyl-group containing synthetic polymers, such as hydroxyethyl methacrylate, hydroxypropyl methacrylate, polyacrylamide, polyvinyl alcohol, polyvinyl pyrrolidone, polyethyleneimine, and the like. Further examples include hydroxyl group terminated, water soluble species of low molecular weigh polymers and oligomers, such as polyethylene oxide, polyoxymethylene, and the like.

The water soluble polymers are wet injected into the water stream, either in the cutting head and/or prior to reaching the cutting head. When wet injected into the cutting head, the cutting head is equipped with at least two intakes, one for the high pressure water stream and the other for the mixture of water soluble polymer and water. When wet injected into the water stream prior to reaching the cutting head, the mixture of water soluble polymer and water is combined with the water stream prior to or after exiting a pump or other device for forming a high pressure water stream.

Wet injection of the water soluble polymer permits the polymer to become hydrated and preferably fully hydrated upon combining with the water jet stream. In instances where the water soluble polymer is combined with the water stream prior to entering a pump, lubricating properties may be realized thereby increasing the life of the pump and/or decreasing maintenance required by the pump. While not wishing to be bound by any theory, it is believed that the water soluble polymer promotes bonding within the water jet stream. And the action of the water soluble polymer is more effective when it is wet injected into the water jet stream.

In the container or storage device containing the water and water soluble polymer and optional organic liquid, the amount of water soluble polymer in the water can vary, but is such that an appropriate amount of water soluble polymer can be delivered to the water stream. For example, the storage device typically contains at least about 1% by weight or more and about 90% by weight or less of one or more water soluble polymers in water. In another embodiment, the storage device typically contains at least about 5% by weight or more and about 80% by weight or less of one or more water soluble polymers in water. In the jet stream expelled from the cutting head of the water jet cutting system, the amount of one or more water soluble polymers in the high pressure water jet stream is about 0.01% by weight or more and about 5% by weight or less for example at about 0.5 gal/min. In another embodiment, the amount of one or more water soluble polymers in the high pressure water jet stream is about 0.05% by weight or more and about 1% by weight or less.

The wet polymer injection system or the water jet cutting system may contain a measuring or metering device to inject a desired amount of the water soluble polymer mixture into the water stream. The metering device takes into account the amount of water soluble polymer in water in the storage device and the amount of water supplied from the water supply to the cutting head, and injects an appropriate amount of the water soluble polymer mixture into the water stream. A control system may be coupled to the metering device to vary the amount of water soluble polymer in water to minimize cracking and chipping of the substrate and OICs on the substrate.

In order to cut OICs in a curvilinear manner using wet injection of water soluble polymers while mitigating cracking and/or chipping of the substrate or the OICs thereon, a nozzle having an I.D. (internal diameter) of about 0.005 inches or more and about 0.05 inches or less is employed. In another embodiment, a nozzle having an I.D. of about 0.01 inches or more and about 0.03 inches or less is employed. Using such nozzles in accordance with the present invention, kerf widths of about 0.05 inches or less are achieved. In another embodiment, kerf widths of about 0.035 inches or less are achieved.

In order to cut OICs in a curvilinear manner using wet injection of water soluble polymers while mitigating cracking and/or chipping of the substrate or the OICs thereon, a standoff distance of about 0.04 inches or more may be employed in accordance with the present invention. Without using wet injection of water soluble polymers, it is necessary to employ a standoff distance of about 0.02 to 0.03 inches or unacceptably high incidences of cracking and/or chipping of the brittle substrate occurs. Standoff distance is the distance between the end of the nozzle and the brittle substrate. In another embodiment, a standoff distance of about 0.05 inches or more may be employed while mitigating cracking and/or chipping of the substrate or the OICs thereon in accordance with the present invention. In yet another embodiment, a standoff distance of about 0.06 inches or more may be employed while mitigating cracking and/or chipping of the substrate or the OICs thereon in accordance with the present invention. Generally, the standoff distance is less than about 1 inch. Greater standoff distances permit in situ monitoring of the curvilinear cutting process.

Furthermore, the pressure employed in order to cut OICs in a curvilinear manner using wet injection of the water soluble polymer while mitigating cracking and/or chipping of the substrate or the OICs thereon is about 35,000 psi or more and about 65,000 psi or less. In another embodiment, the pressure employed in order to cut OICs is about 40,000 psi or more and about 60,000 psi or less.

The substrates with OICs thereon that are cut in accordance with the present invention are made, at least in part, with brittle materials such as silica, monocrystalline silicon, silicon oxynitride, silicate glasses such as tetraethylorthosilicate (TEOS), and the like. Other silicate glasses include phosphosilicate glass (PSG), fluorosilicate glass (FSG), borophosphosilicate glass (BPSG), borophosphotetraethylorthosilicate (BPTEOS), germanium, germanium phosphosilicate, and germanium posophosphosilicate. The brittle nature makes the substrates and/or the OICs thereon readily susceptible to cracking and chipping, which often constitute fatal defects in the OICs (or substantially reduces the performance and/or reliability of the OICs). Since wet injection of the water soluble polymer is employed, a jet stream that mitigates and/or eliminates cracking and chipping in the substrate and/or OICs on the substrate.

The shape of the OICs on a given substrate is typically non-rectangular, but regular. Referring again to FIG. 1, a substrate with a plurality of OICs, in the case PLCs, is shown. When the shape of OICs is regular or consistent (substantially the same), they may be nested on the substrate to maximize the number of OICs fabricated on a given substrate. However, in order to maximize yield, curvilinear cutting must be employed. The present invention permits curvilinear (a line that is curved, not straight) cutting of brittle materials.

In order to conduct curvilinear cutting, either the substrate/workpiece is moved while the cutting head is held stationary, the cutting head is moved while the substrate/workpiece is held stationary, or both the substrate/workpiece and the cutting head are moved. Movement is made in at least two and preferably three dimensions relative to the substrate/workpiece and the cutting head.

Figure 4:
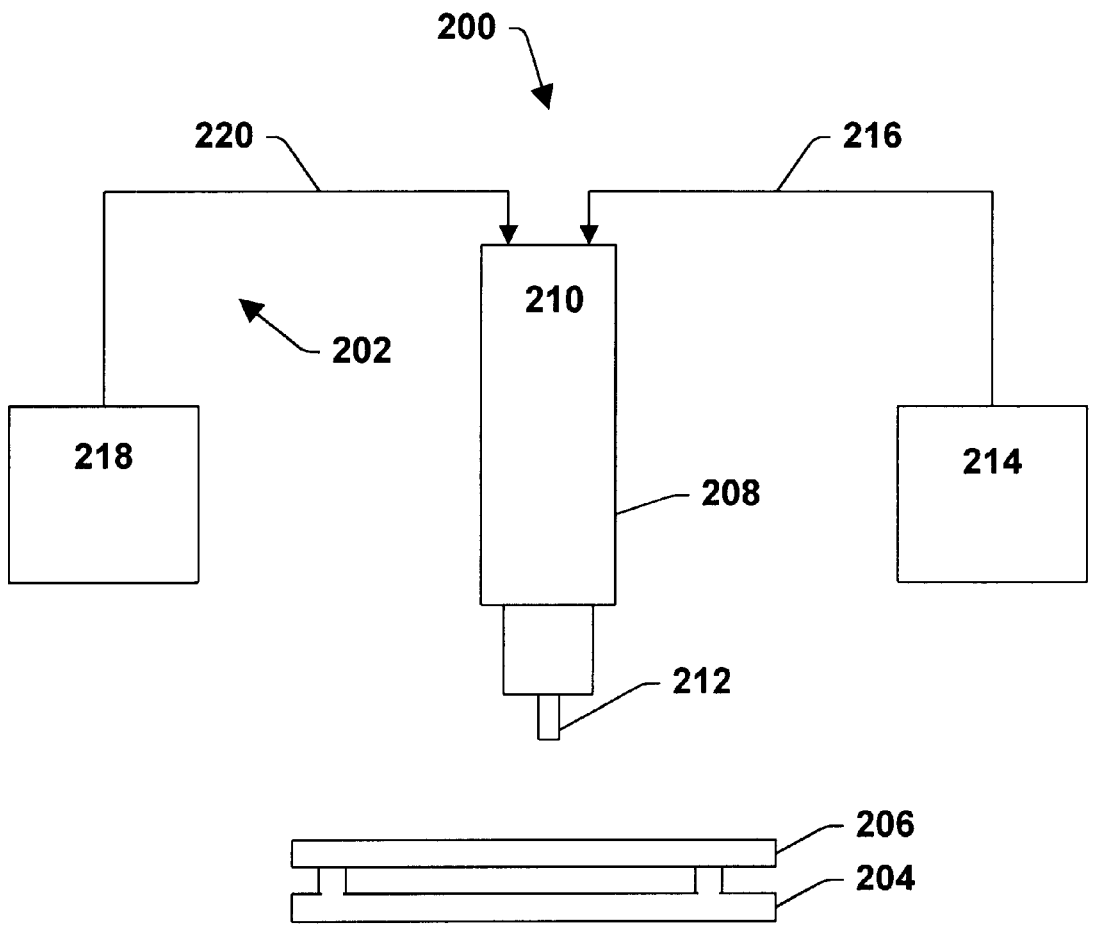
FIG. 4 illustrates a high level schematic of a water jet cutting system in accordance with one aspect of the present invention.

Referring to FIG. 4, a high level schematic of a water jet cutting system 200 in accordance with one aspect of the present invention is shown. Water jet cutting system 200 includes a substrate holder 204 for securing a substrate 206 that will be diced using the system 200. The substrate 206 typically contains a plurality of optical devices (not shown, but see FIG. 1) thereon. Water jet cutting system 200 also includes wet polymer injection system 202, water source 214 for supplying water used in the cutting operation, water supply tube 216 for delivering water from the water source 214 to the cutting head 208, cutting head 208 including a mixing/receiving chamber 210 and nozzle 212. Water source 214 may be a water supply such as a tap, or a storage container. Water from the water source 214 may or may not be pretreated (such as filtered, purified, softened, and the like). Although not shown, a force is imposed on the water traveling through the cutting head 208 in any suitable manner so that a fine high pressure stream of water is expelled from the nozzle 212. For example, water from the water source 214 may travel through a pump where it is then delivered to the cutting head 208 under high pressure.

The wet polymer injection system 202 includes a storage device 218 for housing a mixture of at least one water soluble polymer and water and a delivery tube 220 for delivering the mixture of polymer and water from the storage device 218 to the cutting head 208. Alternatively, the wet polymer injection system 202 may be separate from the water jet cutting system 200 but connected to the system 200. The wet polymer injection system 202 or the water jet cutting system 200 may contain a pump or vacuum system to transfer the mixture of water soluble polymer and water to the water stream/cutting head 208.

In the cutting head 208, the mixture of water soluble polymer and water from storage device 218 mixes and is entrained by the water traveling therethrough from the water source 214. The combination under suitable force forms a high pressure polymer water jet as it is expelled from the nozzle 212.

While not wishing to be bound by any theory, it is believed that the introduction of the water soluble polymer into the main water stream is facilitated as the polymer is hydrated by water in the storage device and/or tube leading to the cutting head and thus does not have to undergo wetting in order to effectively combine with the main water stream. Furthermore, wet injecting a water soluble polymer increases the viscosity of the jet stream thereby leading to increased coherency of jet streams. And wet injection of the water soluble polymer leads to the production of fine water jets that can cut brittle materials such as OICs in a curvilinear manner while minimizing instances of cracking and chipping.

Figure 5:
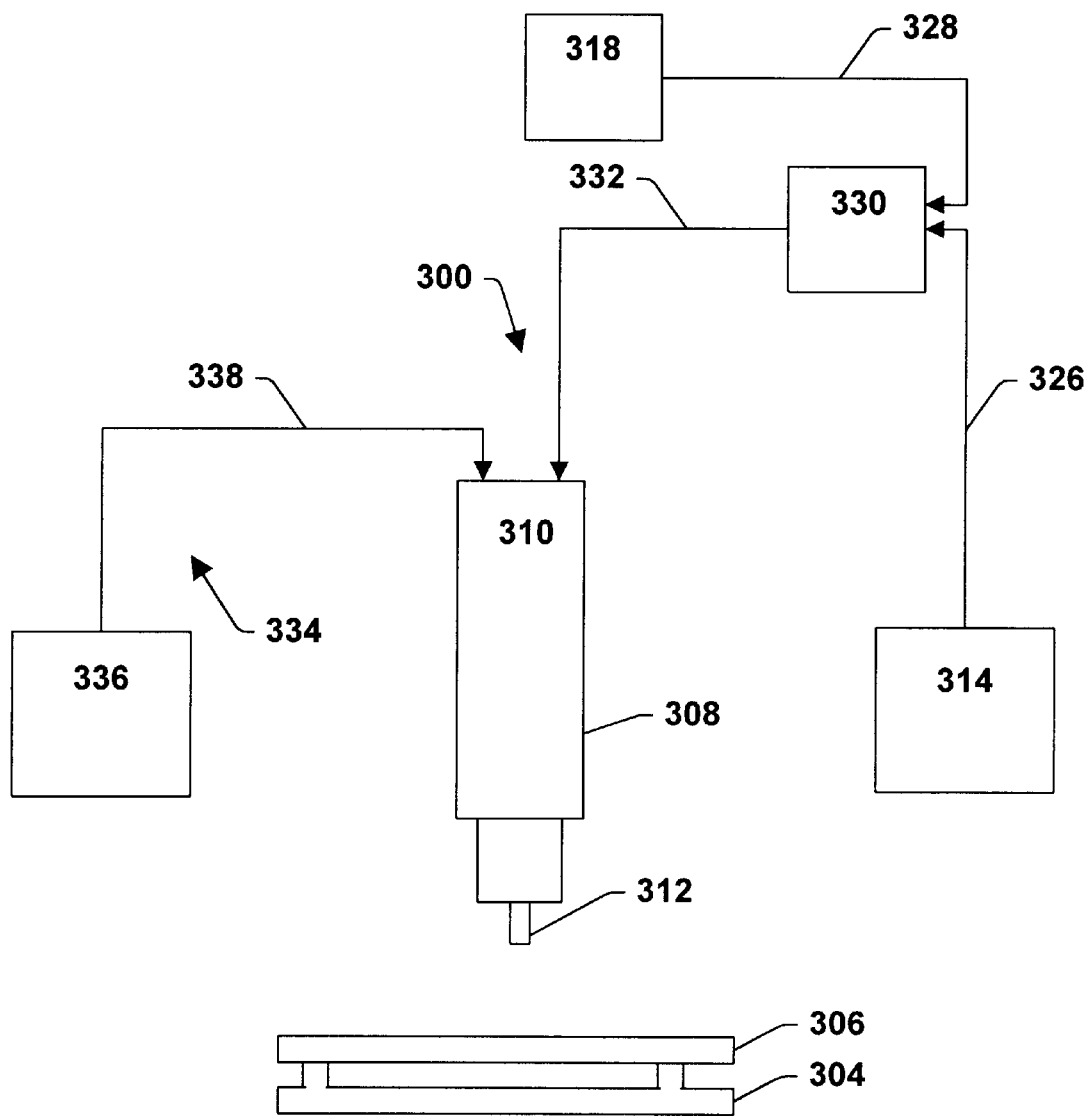
FIG. 5 illustrates a schematic of a water jet cutting system in accordance with another aspect of the present invention.

An optional abrasive injection system may be included in the water jet cutting system. Referring to FIG. 5, a schematic of a water jet cutting system 300 in accordance with another aspect of the present invention is shown. Water jet cutting system 300 includes a substrate holder 304 for securing a substrate 306 that will be diced using the system 300. Water jet cutting system 300 also includes abrasive injection system 334 including abrasive particulate source 336 for supplying abrasive particulates used in the cutting operation and abrasive supply tube 338 between the abrasive particulate source 336 and the cutting head 308, water source 314 for supplying water used in the cutting operation, pump 330 for pressurizing the water flow, water supply tube 326 for delivering water from the water source 314 to the pump 330, cutting head 308 including a mixing/receiving chamber 310 and nozzle 312, a storage device 318 for housing a mixture of at least one water soluble polymer and water, a delivery tube 328 for delivering the mixture of polymer and water from the storage device 318 to the pump 330, and another delivery tube 332 for delivering a high pressure polymer water stream from the pump 330 to the cutting head 308. Wet or dry injection of abrasive particles may be employed. Although not shown, the cutting head 308 may be equipped with two or more abrasive inlets. Water source 314 may be a water supply such as a tap, or a storage container. Pressure from the pump 330 causes the polymer jet water stream traveling through the cutting head 308 so that a fine high pressure stream is expelled from the nozzle 312.

In the cutting head 308, the high pressure polymer water stream from the pump 330 mixes and entrains abrasive particulate from the abrasive particulate source 336. The combination under suitable force forms a high pressure polymer-abrasive water jet as it is expelled from the nozzle 312.

The abrasive injection system 334 may contain a pump or vacuum system to transfer the abrasive particles and optionally water to the cutting head 308. Externally fitted pumps such as a piston displacement pump, internal pumps, venturi vacuum, and the like may be employed.

Any suitable material can be employed as the abrasive particle, provided certain size and/or hardness parameters are met. One of the advantages of the present invention is that relatively small abrasive particles can be used while minimizing clogging of the cutting head and nozzle due to wet injection of the water soluble polymer.

In one embodiment, the abrasive particles have an average diameter of about 0.1 $\mu$m or more and about 1,000 $\mu$m or less. In another embodiment, the abrasive particles have an average diameter of about 1 $\mu$m or more and about 200 $\mu$m or less. In yet another embodiment, the abrasive particles have an average diameter of about 75 $\mu$m or less (about 200 grit, U.S. Standard Sieve Series). In still yet another embodiment, the abrasive particles have an average diameter of about 63 $\mu$m or less (about 230 grit, U.S. Standard Sieve Series). In another embodiment, the abrasive particles have an average diameter of about 53 $\mu$m or less (about 270 grit, U.S. Standard Sieve Series).

In one embodiment, the abrasive particles have an average Mohs' harness of about 5 or more. In another embodiment, the abrasive particles have an average Mohs' harness of about 6 or more. In yet another embodiment, the abrasive particles have an average Mohs' harness of about 6.5 or more.

Examples of materials employed for the abrasive particles include one or more of alumina, ceramic powders, corundum, diamond, garnet, olivine, silica, silicon carbide, tungsten carbide, and the like.

In the jet stream expelled from the cutting head of the water jet cutting system, the amount of abrasive particles in the water stream is about 2% by weight or more and about 60% by weight or less. In another embodiment, the amount of abrasive particles in the water stream is about 5% by weight or more and about 40% by weight or less.

Due to wet injection of the water soluble polymer in the water jet stream, the tendency for abrasive particles to clog the nozzle orifice (or other portions of the cutting head) is significantly reduced. Consequently, the size of abrasive particles can be reduced and/or nozzle orifice diameters can be reduced. Smaller abrasive particles provide comparably smaller diameter jet streams and a reduction in substrate cracking and chipping thereby enhancing cutting and machining precision by producing smaller kerfs. Smaller orifices provide also comparably smaller diameter jet streams enhancing cutting and machining precision by producing smaller kerfs and decreasing media consumption rates. Additionally, since narrower kerfs are realized, more OICs may be formed on a given substrate, thus permitting increased integration and greater yields per wafer.

A metering or measuring device may be coupled to the water jet cutting system so that a precise amount of water soluble polymer, water, and optionally abrasive particles can be used in the cutting stream. The metering device takes into account amount of water soluble polymer in water delivered by the wet injection system, the flow rate of the high pressure water stream with the water soluble polymer, the amount of abrasive required in the polymer jet stream, and the like. A control system may be coupled to the metering device to vary the amount of water soluble polymer, water, and optionally abrasive particles to minimize cracking and chipping of the substrate and OICs on the substrate. Such systems and methods are further described in FIGS. 6 and 7.

Figure 6:
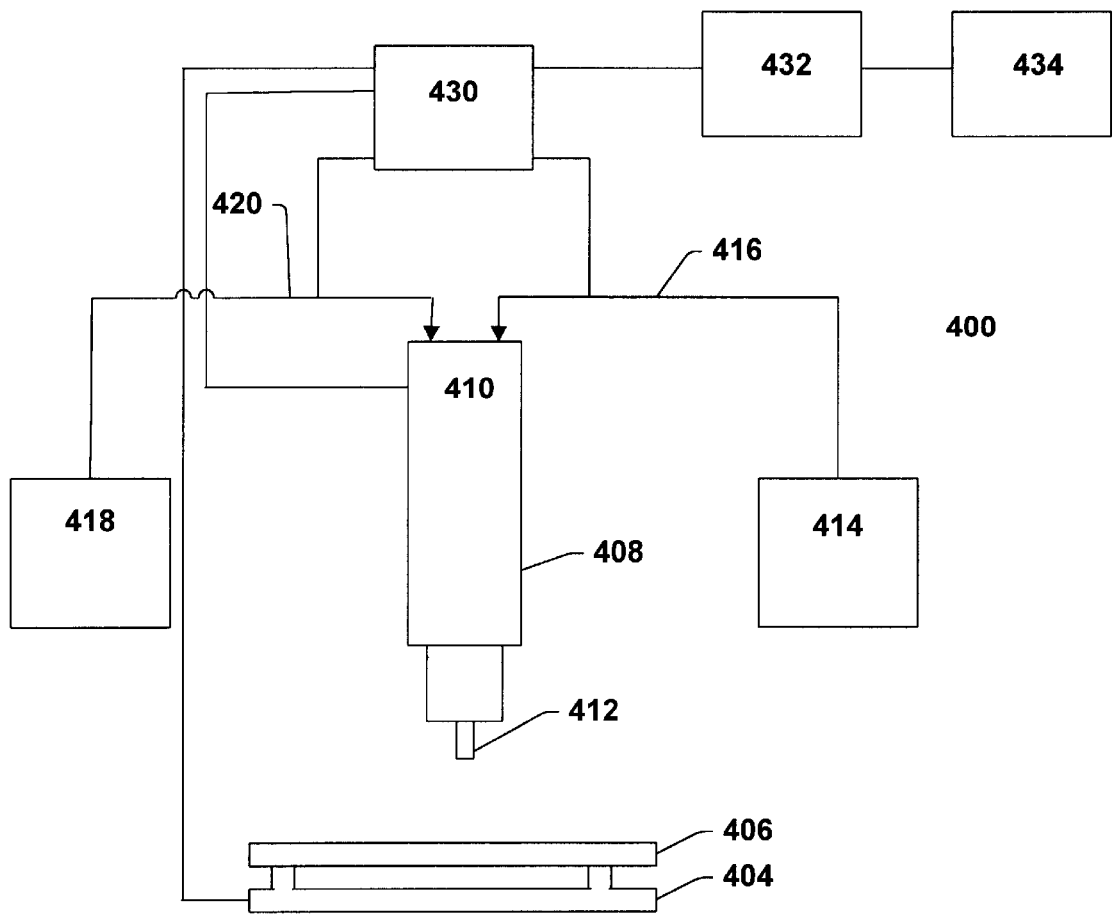
FIG. 6 illustrates a schematic of a water jet cutting system in accordance with yet another aspect of the present invention.

For example, processor control and/or automated feedback control is employed to dice OICs from a substrate in another aspect of the present invention. Referring to FIG. 6, a water jet cutting system 400 in accordance with another embodiment of the present invention is shown. Water jet cutting system 400 includes a substrate holder 404 for securing a substrate 406 that will be diced using the system 400. Water jet cutting system 400 also includes wet polymer injection system 418/420, water supply 414 for supplying water used in the cutting operation, water supply tube 416 for delivering water from the water supply 414 to the cutting head 408, cutting head 408 including a receiving chamber 410 and nozzle 412. The wet polymer injection system includes a storage device 418 for housing a mixture of at least one water soluble polymer and water and a delivery tube 420 for delivering the mixture of water soluble polymer and water from the storage device 418 to the cutting head 408. Although not shown, the system 400 may be configured so that water supply tube 416 and delivery tube 420 both lead to a pump where the water and waterpolymer mixture are mixed and delivered to the cutting head 408 under high pressure.

Water jet cutting system 400 further includes or is coupled to controller 430, processor 432, and memory 434. Specifically, controller 430 is coupled to one or more of the water supply 414 or water supply tube 416 to provide a desired amount and pressure of water delivered from the water supply 414 to the cutting head 408; to the storage device 418 or delivery tube 420 to provide a desired amount under a desired pressure of the mixture of water soluble polymer and water from the storage device 418 to the cutting head 408; to the substrate holder 404 to move/position the substrate 406 to desired locations and positions below the cutting head 408; to the cutting head 408 or pump (not shown) to ensure desired amounts of water and mixture are combined; and to the processor 432 for controlling the controller 430.

Processor 432 directs the activity of the controller 430 based on certain data, such as the identity and other parameters associated with the substrate 406, the identity of the OICs, the amount of water soluble polymer in the mixture, the flow rate of the polymer water stream in the cutting head 408, the width of the nozzle 412 orifice, the identity of the water soluble polymer, and the like, and the data is stored in memory 434. The processor 432 and memory 434 may be comprised by a computer.

In the cutting head 408 (or in the pump in alternative embodiment), the mixture of water soluble polymer and water from storage device 418 mixes and is entrained by the water traveling therethrough from the water supply 414. The controller 430 governs the amount of the mixture of water soluble polymer and water from storage device 418 and the amount and flow rate of water from the water supply 414. The combination under suitable force forms a high pressure polymer water jet as it is expelled from the nozzle 412 to cut, in a curvilinear manner, OICs from the substrate 406. The controller 430 governs the position/path at which the substrate 406 is held during water jet cutting.

Figure 7:
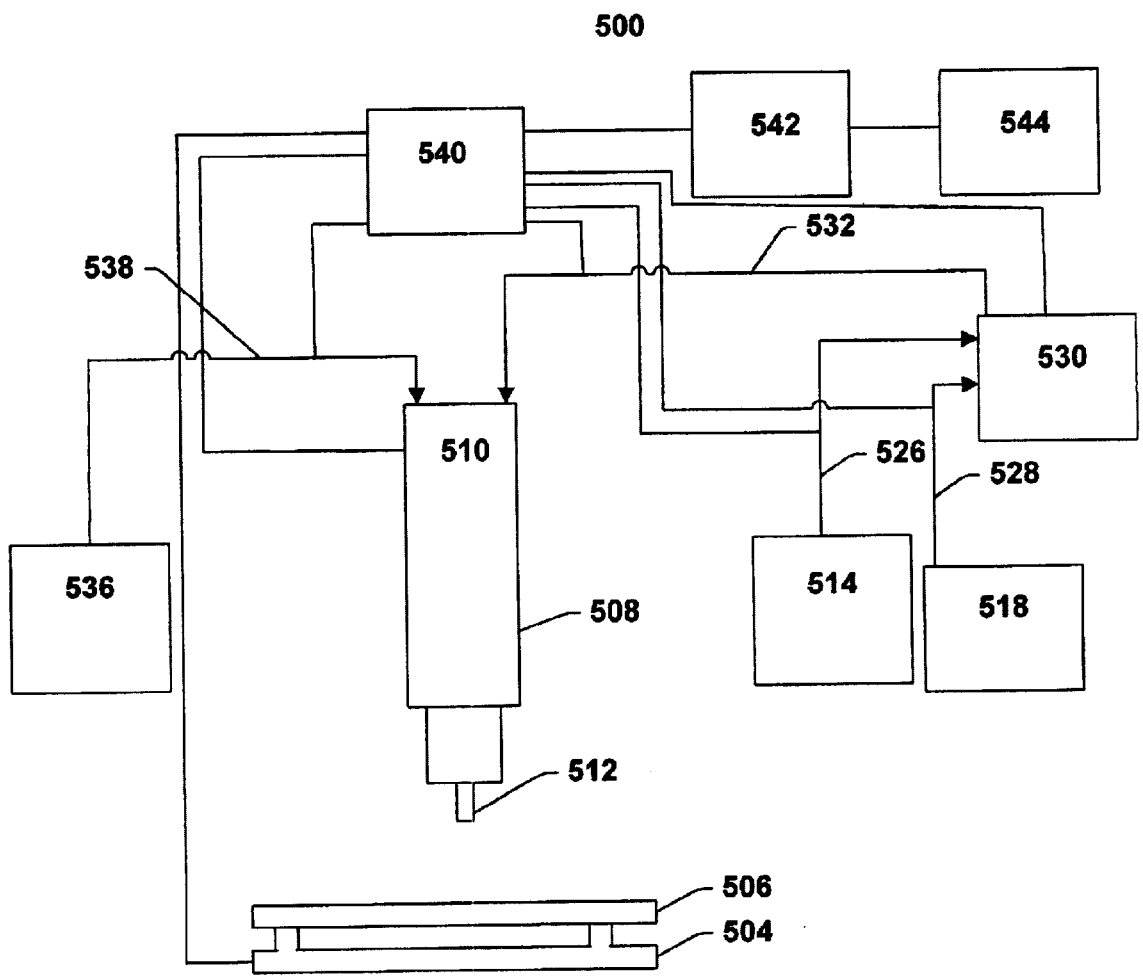
FIG. 7 illustrates a schematic of a water jet cutting system in accordance with still yet another aspect of the present invention.

Referring to FIG. 7, a water jet cutting system 500 in accordance with yet another embodiment of the present invention is shown. Water jet cutting system 500 includes a substrate holder 504 for securing a substrate 506 that will be diced using the system 500. Water jet cutting system 500 also includes an abrasive injection system 536/538, water supply 514 for supplying water used in the cutting operation, water supply tube 526 for delivering water from the water supply 514 to a pump 530, cutting head 508 including a mixing/receiving chamber 510 and nozzle 512, a storage device 518 for housing a mixture of at least one water soluble polymer and water, a delivery tube 528 for delivering the mixture of polymer and water from the storage device 518 to the pump 530, and another delivery tube 532 for delivering a high pressure polymer water stream from the pump 530 to the cutting head 508. The abrasive injection system includes a storage device 536 for housing abrasive particles and optionally water and a delivery tube 538 for delivering the abrasive particles and optionally water from the storage device 536 to the cutting head 508.

Water jet cutting system 500 further includes or is coupled to controller 540, processor 542, and memory 544. Specifically, controller 540 is coupled to one or more of the water supply 514 or water supply tube 526 to provide a desired amount of water delivered from the water supply 514 to the pump 530; to the storage device 518 or delivery tube 528 to provide a desired amount of the mixture of water soluble polymer and water from the storage device 518 to the pump 530; to the pump 530 and/or supply line 532 to provide a desired amount and pressure of the water soluble polymer and water to the cutting head 508; to the substrate holder 504 to move/position the substrate 506 to desired locations and positions below the cutting head 508; to the cutting head 508 to ensure desired amounts of polymer water stream and abrasive are combined in the cutting head 508; and to the processor 542 for controlling the controller 540.

Processor 542 directs the activity of the controller 540 based on certain data, such as the identity and other parameters associated with the substrate 506, the identity of the OICs, the amount of water soluble polymer in the mixture, the flow rate/pressure of the polymer water jet supplied to the cutting head 508, the width of the nozzle 512 orifice, the amount, identity and size of the abrasive, and the like, and the data is stored in memory 544. The processor 542 and memory 544 may be comprised by a computer.

In the cutting head 508, the abrasive particles from storage device 536 mixes and is entrained by the polymer water stream traveling therethrough from the pump 530. The controller 540 governs the amount of abrasive particles from storage device 536 and the amount and flow rate of polymer water stream from the pump 530. The combination under suitable force forms a high pressure abrasive polymer water jet as it is expelled from the nozzle 512 to cut, in a curvilinear manner, OICs from the substrate 506. The controller 540 governs the position/path at which the substrate 506 is held during water jet cutting.

Although the invention has been shown and described with respect to certain illustrated implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

In addition, while a particular feature of the invention may have been disclosed with respect to only one of several implementations, such feature may be combined with one or more other features of the other implementations as may be desired and advantageous for any given or particular application. As used in this application, the term "component"0 is intended to refer to a computer related entity, either hardware, a combination of hardware and software, software, or software in execution. For example, a component may be, but is not limited to, a process running on a processor, a processor, an object, an executable, a thread of execution, a program, and a computer. Furthermore, to the extent that the terms "includes", "including", "with", "has", "having", and variants thereof are used in either the detailed

What is claimed is:

1. A method of cutting a brittle substrate comprising a non-rectangular shaped optical integrated circuit, comprising:
   providing the brittle substrate comprising a plurality of non-rectangular shaped optical integrated circuits on a water jet cutting system, the brittle substrate positioned proximate a cutting head of the water jet cutting system;
   supplying a high pressure water stream to the cutting head;
   wet injecting a mixture of water and at least one water soluble polymer into the water stream; and
   water jet cutting the brittle substrate in a curvilinear manner to separate at least one of the plurality of non-rectangular shaped optical integrated circuits without fatally damaging an adjacent optical integrated circuit.

2. The method according to claim 1, wherein the brittle substrate comprises one or more selected from the group consisting of monocrystalline silicon, silicon dioxide, silicon oxynitride, and silicate glasses.

3. The method according to claim 1, wherein the mixture comprises at least about 10% by weight or more and about 99% by weight or less of water and at least about 1% by weight or more and about 90% by weight or less of at least one water soluble polymer.

4. The method according to claim 1, wherein water jet cutting involves contacting the brittle substrate with a jet stream comprising at least about 90% by weight or more and about 99.99% by weight or less of water and at least about 0.01% by weight or more and about 5% by weight or less of at least one water soluble polymer.

5. The method according to claim 1, wherein the optical integrated circuit is a planar lightwave circuit.

6. The method according to claim 1, wherein the water soluble polymer comprises at least one of guar gum, xanthan gum, hydroxypropyl derivatives of guar gum, hydroxyethyl derivatives of guar gum, hydroxypropyl derivatives of xanthan gum, hydroxyethyl derivatives of xanthum gum, arabic, tragacanth, karaya, hydroxymethyl cellulose, hydroxyethyl cellulose, hydroxyethyl methacrylate, hydroxypropyl methacrylate, polyacrylamide, polyvinyl alcohol, polyvinyl pyrrolidone, polyethyleneimine, polyethylene oxide, and polyoxymethylene.

7. The method according to claim 1, further comprising injecting abrasive particles into the water stream comprising at least one water soluble polymer.

8. A system for separating a plurality of non-rectangular shaped optical integrated circuits formed on a brittle substrate, comprising:
   a brittle substrate holder for holding the brittle substrate comprising the plurality of optical integrated circuits;
   a supply of a mixture of water and at least one water soluble polymer connected to a water jet cutting device;
   a water supply connected to the water jet cutting device;
   the water jet cutting device comprising a cutting head; and
   the cutting head comprising a nozzle for expelling a jet stream under pressure for cutting the brittle substrate in a curvilinear manner, at least one of the brittle substrate holder and the cutting head movable in a curvilinear manner.

9. The system according to claim 8, wherein the supply of the mixture and the water supply are connected to the water jet cutting device through a pump.

10. The system according to claim 8, wherein the mixture comprises at least about 10% by weight or more and about 99% by weight or less of water and at least about 1% by weight or more and about 90% by weight or less of at least one water soluble polymer.

11. The system according to claim 8, further comprising a supply of abrasive particles connected to the cutting head.

12. The system according to claim 8, wherein the cutting head comprises a nozzle having an orifice with an internal diameter of about 0.005 inches or more and about 0.05 inches or less.

13. The system according to claim 8, further comprising a processor coupled to a controller, the controller coupled to the supply of the mixture for metering a desired amount of the mixture of water and at least one water soluble polymer with water from the water supply.

14. A method of water jet cutting a silicon substrate in a curvilinear manner, comprising:
   providing the silicon substrate on a water jet cutting system, the silicon substrate positioned proximate a cutting head having an orifice of the water jet cutting system;
   wet injecting a mixture of water and at least one water soluble polymer into a water stream;
   supplying the water stream comprising at least one water soluble polymer to the cutting head under high pressure;
   expelling a polymer water jet from the orifice to contact the silicon substrate; and
   moving the silicon substrate in a curvilinear manner in relation to the cutting head to cut the silicon substrate in a curvilinear manner while reducing at least one of chipping the silicon substrate and cracking the silicon substrate.

15. The method according to claim 14, wherein the silicon substrate comprises a plurality of non-rectangular shaped optical integrated circuits, and each of the non-rectangular shaped optical integrated circuits is isolated by cutting the silicon substrate in a curvilinear manner.

16. The method according to claim 14, wherein the silicon substrate comprises silicon and at least one selected from the group consisting of silicon dioxide, silicon oxynitride, and silicate glasses.

17. The method according to claim 14, wherein the cutting head comprises a nozzle having an orifice with an internal diameter of about 0.005 inches or more and about 0.05 inches or less.

18. The method according to claim 14, wherein the polymer water jet is expelled from the orifice at about 35,000 psi or more and about 65,000 psi or less.

19. The method according to claim 14, wherein the mixture comprises at least about 20% by weight or more and about 95% by weight or less of water and at least about 5% by weight or more and about 80% by weight or less of at least one water soluble polymer.

20. The method according to claim 14, wherein the polymer water jet expelled from the orifice comprises at least about 90% by weight or more and about 99.95% by weight or less of water and at least about 0.05% by weight or more and about 1% by weight or less of at least one water soluble polymer.

* * * * *